United States Patent
Paumier et al.

(10) Patent No.: US 7,725,810 B2
(45) Date of Patent: May 25, 2010

(54) DECODING OF MULTIPLE DATA STREAMS ENCODED USING A BLOCK CODING ALGORITHM

(75) Inventors: Laurent Paumier, Grenoble (FR); Pascal Urard, Theys (FR); Martial Comminges, Les Adrets (FR)

(73) Assignee: STMicroelectronics SA, Montrouge (FR)

( * ) Notice: Subject to any disclaimer, the term of this patent is extended or adjusted under 35 U.S.C. 154(b) by 825 days.

(21) Appl. No.: 11/534,476

(22) Filed: Sep. 22, 2006

(65) Prior Publication Data

US 2007/0094565 A1 Apr. 26, 2007

(30) Foreign Application Priority Data

Sep. 23, 2005 (FR) .................................. 05 09788

(51) Int. Cl.
*G06F 11/00* (2006.01)
(52) U.S. Cl. .................................................... 714/800
(58) Field of Classification Search ................. 714/752, 714/755, 786, 795, 800–801; 375/262, 341
See application file for complete search history.

(56) References Cited

U.S. PATENT DOCUMENTS

| | | | | |
|---|---|---|---|---|
| 5,509,021 | A * | 4/1996 | Todoroki | 714/795 |
| 7,042,950 | B2 | 5/2006 | Yamana et al. | 375/240.25 |
| 7,185,269 | B2 * | 2/2007 | Mar et al. | 714/795 |
| 7,571,369 | B2 * | 8/2009 | Wang et al. | 714/755 |
| 2002/0007474 | A1 * | 1/2002 | Fujita et al. | 714/755 |

FOREIGN PATENT DOCUMENTS

| | | |
|---|---|---|
| EP | 1 313 311 | 5/2003 |
| EP | 1 264 475 | 5/2004 |
| EP | 1 648 090 | 4/2006 |
| WO | 2005/029789 | 3/2005 |

OTHER PUBLICATIONS

"Digital Video Broadcasting (DVB); Second generation framing structure, channel coding and modulation systems for Broadcasting, Interactive Services, News Gathering and other broadband satellite applications," ETSI Standards, European Telecommunications Standards Institute, ETSI EN 302 307, V1.1.1, Mar. 2005.
P. Urard et al., "A 135Mb/s DVB-S2 Compliant Codec Based on 64800b LDPC and BCH Codes," 2005 IEEE International Solid-State Circuits Conference, Digest of Technical Papers, pp. 446-448.

* cited by examiner

*Primary Examiner*—Shelly A Chase
(74) *Attorney, Agent, or Firm*—Lisa K. Jorgenson; Robert Iannucci; Seed IP Law Group PLLC

(57) ABSTRACT

A system implemented for example in the form of an SoC comprises a first demodulator for generating a first data stream to be decoded, and a second demodulator for generating a second data stream to be decoded, and a block decoder. The block decoder comprises an input memory for storing blocks of data from the first data stream and blocks of data from the second data stream, and a block decoding unit for processing, from the input memory, the blocks of data from the first and second data streams.

19 Claims, 7 Drawing Sheets

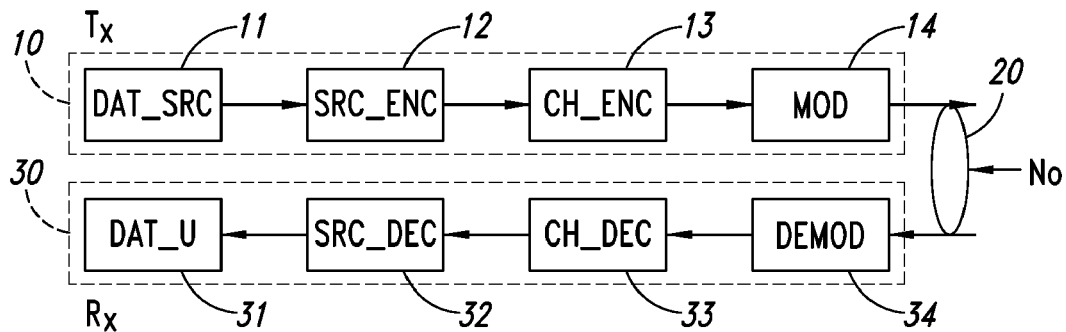

DECODING OF MULTIPLE DATA STREAMS ENCODED USING A BLOCK CODING ALGORITHM

TECHNICAL FIELD

The present disclosure generally concerns the decoding of data coded using a block coding algorithm.

It has applications particularly but not exclusively in devices for receiving signals transmitted by satellite, for example using the satellite digital video broadcasting standard DVB-S2, which stipulates the use of a low density parity check ("LDPC") code to protect the data transmission.

BACKGROUND INFORMATION

LDPC codes are a class of error correction codes invented in 1960 by Robert Gallager of MIT ("Massachusetts Institute of Technology"), constituting an alternative to the Viterbi codes as well as to the more recent turbo codes. LDPC codes are block codes which allow approaching the Shannon Limit. The first commercial standard stipulating the use of an LDPC code is the DVB-S2 standard, which is the second-generation ETSI ("European Telecommunication Standardization Institute") standard for satellite digital video broadcasting. LDPC coding is included in it for channel coding, to protect the sent data from noise affecting the transmission channel.

With reference to FIG. 1, a generic transmission subsystem contains, on the side of the sender 10, a data source 11 (denoted DAT_SRC in the figure), followed by a source encoder 12 (denoted SCR_ENC in the figure), a channel encoder 13 (denoted CH_ENC in the figure), and a modulator 14 (denoted MOD in the figure). The source encoder 12 compresses the data (for example using a standard such as MPEG, H264, etc.) so as to reduce the bit rate of the data to be transmitted. The channel encoder adds redundancy (for example by using an LDPC code) to enable the receiver 30 to correct potential errors due to the noise introduced into the transmission channel 20. The modulator 14 adapts the signal to the transmission channel (for example, satellite transmission channel, radio transmission channel, etc.). On the receiver side 30, a demodulator 34 (denoted DEMOD in the figure), followed by a channel decoder 33 (denoted CH_DEC in the figure), and a source decoder 32 (denoted SRC_DEC in the figure), perform operations dual to those performed by the modulator 14, the encoder 13, and the encoder 12, respectively. The demodulated and decoded data are then restored to the entity that uses the data 31 (denoted DAT_U in the figure).

When the channel coding uses a block coding algorithm, as is the case for LDPC codes, the channel decoder comprises an input memory, or channel memory, for storing the data to be decoded. In the known decoders, this memory may comprise a first single port storage element configured for storing a block of bits corresponding to a previously received code word which is currently being decoded, and a second single port storage element configured for storing another block of bits corresponding to a code word currently being received. The processes of receiving and decoding may thus be simultaneous. To avoid the input memory of the decoder becoming full, the block decoding time must be less than the block receiving time. In order to have the highest possible bit rate, the block receiving time must be as low as possible. Therefore, as a general rule, the block decoding time is close to the block receiving time while being less than this receiving time.

BRIEF SUMMARY

One embodiment of the present invention particularly applies to digital satellite television receivers which provide simultaneous demodulation and decoding of at least two different data streams. In systems of this type, for example, a first data stream may correspond to a program watched by a user, while a second data stream may correspond to a program being saved at the same time to a hard drive or similar storage. Other applications can of course result in simultaneous demodulation and decoding of at least two different data streams coded using a block coding algorithm, and are therefore also concerned by embodiments of the present invention. Although block coding algorithms are generally used for channel coding, embodiments of the invention are not limited to this use, and in fact applies to any type of block coding.

In receivers of the abovementioned type, currently two front end chips are used, respectively ensuring the demodulation and decoding of each of the two streams. This solution implies a high cost, particularly the cost of the two chips and the cost of their integration into the system.

This is why an embodiment of the invention enables decoding at least two data streams coded with a block coding algorithm, such as an LDPC code, using a single decoder.

To this end, according to a first aspect, the invention proposes a block decoder for this purpose, comprising:
 a first input and at least a second input for respectively receiving a first data stream for decoding and a second data stream for decoding which is distinct from said first data stream,
 an input memory with storage elements configured for storing blocks of data from the first data stream and blocks of data from the second data stream,
 a block decoding unit configured to process from the input memory the blocks of data from the first and second data streams, and
 a control unit for multiplexing the blocks of data from the first data stream and the blocks of data from the second data stream as input to the block decoding unit, which is achieved by saving and reading them in the storage elements of the input memory.

One embodiment of the invention utilizes the possibility of designing an LDPC decoding unit which is at least twice as fast as is required by the end application. In fact, it is currently known how to design LDPC decoders meeting the standard which can process data with an input bit rate of several hundred megabits/second (Mbps). One may refer to the article "A 135 Mbps DVB-S2 Compliant Codec based on 64800-bit LDPC and BHC Codes", P. Urard et al., Proc. IEEE ISSCC 2005, pp. 446-447, February 2005, San Francisco, Calif., concerning this.

Thanks to embodiments of the invention, a single system may integrate two demodulators and one LDPC decoder, to enable the demodulation and decoding of two distinct data streams. A second aspect of the invention relates to a system comprising:
 a first demodulator for generating a first data stream to be decoded, and a second demodulator for generating a second data stream to be decoded, and
 a block decoder according to the first aspect of the invention for decoding the data from the first and second data streams.

Such a system may be implemented in the form of a System on Chip (SoC), meaning it is integrated in a single integrated circuit package.

The increase in the silicon surface area occupied by an integrated circuit having two demodulators and one LDPC decoder in comparison to an integrated circuit having one demodulator and one LDPC decoder is slight, for the following reasons. Firstly, the silicon surface area occupied by a demodulator is 5 to 15 times smaller than that occupied by an LDPC decoder. Secondly, the increase in the silicon surface area occupied by an LDPC decoder twice as fast as a standard LDPC decoder is not excessive, given that the major part of the silicon surface area occupied by the LDPC decoder corresponds to storage elements whose capacity does not depend on the processing speed for a given decoding algorithm.

A third aspect of the invention relates to a receiver for satellite transmissions comprising a system according to the second aspect.

Finally, a fourth aspect of the invention concerns a method of block decoding comprising:

the receiving of a first data stream to be decoded and at least a second data stream to be decoded which is distinct from said first stream, the storage in the storage elements of an input memory of a block decoder, of at least one block of data from the first data stream and at least one block of data from the second data stream, the block decoding from the input memory, by the block decoder, of blocks of data from the first and second data streams, and, the multiplexing of blocks of data from the first stream and blocks of data from the second stream as input to the block decoding unit, which is achieved by saving and reading them in the storage elements of the input memory.

BRIEF DESCRIPTION OF THE SEVERAL VIEWS OF THE DRAWINGS

Other features of one or more embodiments of the invention will become apparent in reading the following description. This is purely illustrative and non-limiting and should be read with reference to the attached drawings, in which:

FIG. 1, already described, is a diagram illustrating a generic data transmission subsystem, FIG. 2 shows an example of a parity check matrix and illustrates its application in an LDPC frame according to an embodiment, FIG. 3 illustrates the example calculations for updating check nodes and bit nodes performed using the parity check matrix of FIG. 2 according to an embodiment.

DETAILED DESCRIPTION

Figure 4:
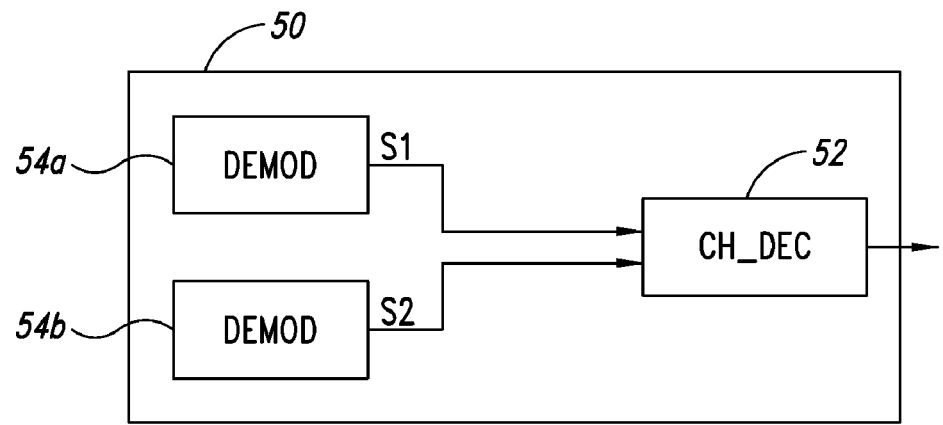
FIG. 4 is a diagram illustrating the sharing of a decoder in a system according to embodiments of the invention, for the processing of two data streams to be decoded.

In the following description, numerous specific details are given to provide a thorough understanding of embodiments. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Embodiments of the invention are given below for the case of data coded with an LDPC code. The LDPC codes are block codes. On the transmitter side, the LDPC encoder processes blocks of K information bits, and outputs code words of N bits, also called LDPC frames, where N>K. In other words, it adds N−K redundancy bits which enable the correction of transmission errors on the receiver side. These N−K bits are called parity bits. The code rate is defined as the ratio r=K/N. The smaller the r, the higher the redundancy, and therefore the higher the protection against noise in the transmission channel.

The N−K bits added to each block of K information bits are calculated using an H matrix, called the parity check matrix. This H matrix has N−K rows and N columns. It contains "0" and "1" values, with the latter in low proportions, which is why codes based on such a parity matrix are called low density parity check codes.

With reference to FIG. 2, an N-bit LDPC frame, in which the K low order bits correspond to the information bits and the N−K high order bits correspond to the parity bits, is the code word C delivered by an LDPC encoder which satisfies the relation:

$$H \times C^t = 0$$

The check node degree for a row in the H matrix is the number of "1" values in the row, and the bit node degree for a column in the H matrix is the number of "1" values in the column. There exist two types of LDPC code: the regular codes and the irregular codes. The H matrix for a regular code has a constant number of "1" values per row and per column, meaning that the check node degrees and bit node degrees are constant. Conversely, the H matrix for an irregular code does not have constant check node degrees and/or bit node degrees, and is therefore more random in character. The best performance is obtained with irregular codes, but the decoding may then be more difficult. The DVB-S2 standard recommends the use of an H matrix which has constant check node degrees, between 4 and 30 (abbreviated as matrix check node degree), and bit node degrees which may assume three values between 2 and 13.

On the receiver side, the LDPC decoder corrects the erroneous bits by using the relations between the bits in the LDPC frames received through the transmission channel, corresponding to a word C'. These relations are given by the parity check matrix H, which is of course known to the decoder.

More particularly, the LDPC decoder processes log-likelihood ratios (LLR). On the receiver side, there is an LLR for each of the N bits of an LDPC frame which was sent from the transmitter. For a transmitted bit d which has a corresponding signal x received by the LDPC decoder after noise is added to the transmission channel, the LLR ratio for the bit d in relation to the signal x is defined as:

$$LLR(x) = LLR(d/x) = \ln \frac{P(d=0/x)}{P(d=1/x)}$$

where P(d=0/x) is the probability that the transmitted bit d is equal to 0 as a function of the value x received, and P(d=1/x) is the probability that the transmitted bit d is equal to 1 as a function of the value x received. Each LLR is coded in m bits.

The LDPC decoder uses internal metrics, equal in number to the number of "1" values in the H matrix. These metrics are each coded in t bits. The decoder updates them using an iterative algorithm.

With reference to FIG. 3, each iteration comprises update steps performed by row, including determining for each row the first new values for the internal metrics of the row as a function of the other internal metrics of the row ("check node update"), then update steps performed by column, including determining for each column the second new values for internal metrics of the column as a function of the other internal metrics of the column and the LLR corresponding to this column ("bit-node update"). For decoding a received LDPC frame, in order to retrieve a block of N data sent, the decoder performs several iterations. The decoded bits, called hard decision bits, are then obtained by adding the internal metrics by column with the LLRs for the C' word received, and taking the sign of the result.

With reference to FIG. 4, a system 50 according to the embodiments of the invention comprises two demodulators 54a and 54b, and a decoder 52, for example a channel decoder. For example, this is a system for receiving signals sent using the DVB-S2 standard, the 54a, 54b demodulators are for example 8-PSK demodulators, and the decoder 52 is for example an LDPC decoder. Even so, a person skilled in the art will appreciate that one embodiment of the invention applies to any type of block decoder.

The demodulator 54a generates a first stream S1 of data to be decoded. The demodulator 54b generates a second stream S2 of demodulated data to be decoded. These data are organized into blocks in relation to the LDPC frames sent from the transmitter.

The decoder 52 may provide a multiplexing function, having a first input for receiving the stream S1 and a second input for receiving the stream S2. For example, the decoder may be configured to alternate between processing a block of data from stream S1 corresponding to a code word to be decoded, then a block of data from stream S2 corresponding to another code word to be decoded. Other forms of time multiplexing are of course possible.

Figure 5:
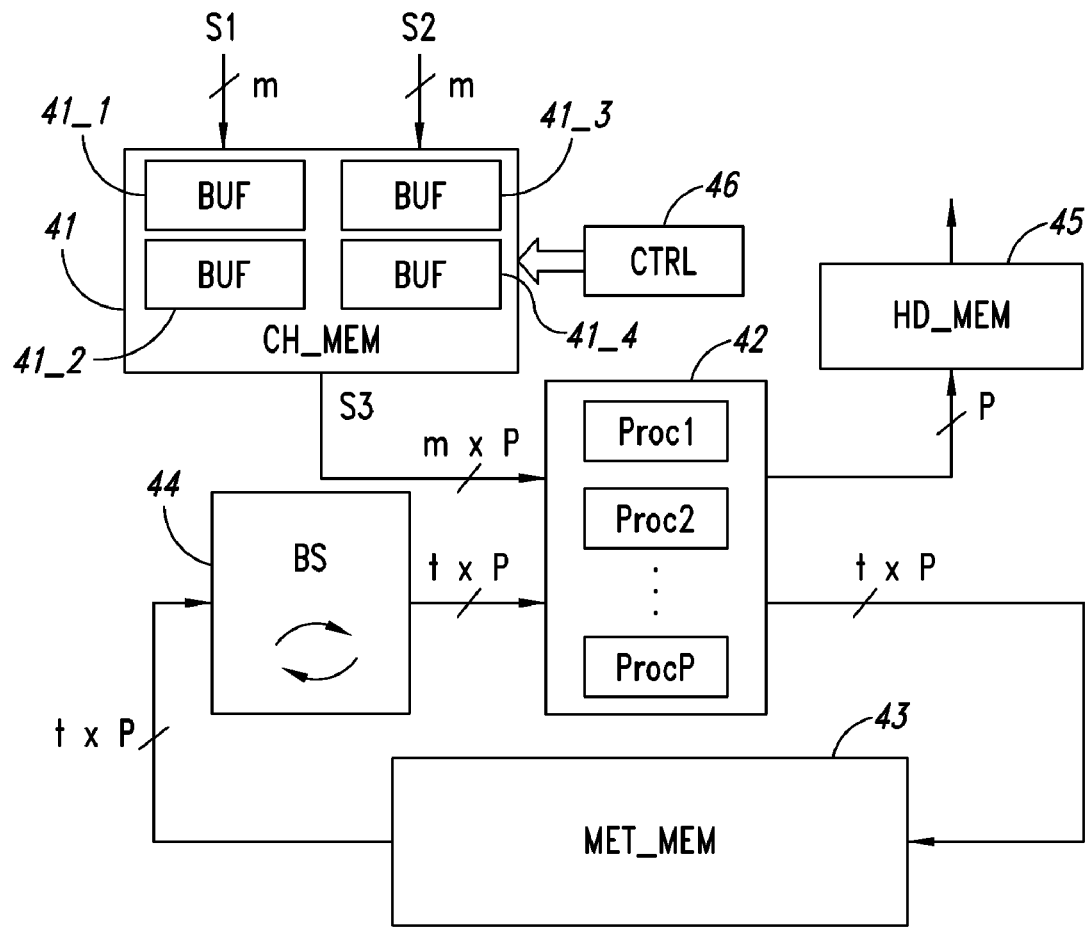
FIG. 5 is a diagram of the architecture of an LDPC decoder according to embodiments of the invention.

With reference to FIG. 5, an example architecture for the LDPC decoder 52 comprises, according to some embodiments, an input memory or a channel memory 41 (denoted CH_MEM in the figure) which can store blocks of data to be decoded corresponding to four LDPC frames sent from the transmitter side. These data in fact correspond to 4×N LLRs.

More particularly, the memory 41 comprises at least four single port storage elements 41_i, where i assumes the values of whole numbers between 1 and 4, instead of two such storage elements for the input memory of a decoder in the prior art. Each of these storage elements is configured to store a block of data to be decoded, with such a block here indicating the unit of data processed by the decoding algorithm. In other words, each storage element 41_i is configured to store a block of N×m bits corresponding to the N LLRs associated with a word previously received and currently being decoded, or a block of N×m bits corresponding to the N LLRs associated with a code word currently being received.

For example, the storage elements 41_i are single port RAM (or SPRAM), each forming a buffer.

Under the control of a control unit 46, blocks of data from the stream S1 and blocks of data from the stream S2 are multiplexed via saving and reading them in the storage elements 41_i of the storage 41.

In one embodiment (hereinafter the first embodiment), wherein the maximum bit rate for each of the streams S1 and S2 is always less than M/2 where M designates the maximum input bit rate for the decoder 52, the memory 41 comprises a pair of storage elements (for example the elements 41_1 and 41_2) which is used to store the data from the stream S1, and another pair of storage elements (for example the elements 41_3 and 41_4) which is used to store the data to be decoded from the stream S2. In other words, in this first embodiment, the data from each of the streams S1 and S2 pass only through the storage elements of one of the pairs of elements 41_1, 41_2, and 41_3, 41_4 respectively.

In another embodiment (hereinafter the second embodiment), wherein the maximum respective bit rates for each of the streams S1 and S2 may be greater than M/2 but their sum is always less than M, the registers 41_i where i assumes the values of whole numbers between 1 and 4, are used by order of priority for storing data from streams S1 and S2. In other words, in this embodiment, the data to be decoded from streams S1 and S2 may pass through any of the four storage elements 41_i. Unlike the first embodiment, this second embodiment allows decoding data streams which have a higher bit rate, while using the same number of storage elements. However, the management of the storage elements is more complex, as will now be shown.

Examples of storage element management algorithms, both for reading and writing, will be presented further on. These algorithms are implemented in the control unit 46. Said unit 46 is represented here as a separate functional entity, but it may be implemented as hardware and/or software as a part of another decoder element, for example the memory 41 itself, or of a decoding unit which will now be described.

In order to accelerate the calculations related to decoding, the decoding unit comprises a processor bank 42, comprising a number P of parallel processors (denoted Proc1 to ProcP in the figure) which perform in parallel the calculations for the check nodes and bit nodes. The number P is called the parallelism index. The processor bank 42 has read access to the input memory 41 via a bus of m×P wires, controlled by the unit 46.

During execution of the iterative process, the processors deliver updated values of internal metrics, each coded in t bits. The internal metrics are stored in a metric memory 43 (denoted MET_MEM in the figure), which has a capacity equal to t times the number of metrics (meaning t times the number of "1" values in the H matrix). The internal metrics stored in the memory 43 are delivered to the processor bank 42 via a mixer with P channels, such as a barrel shifter 44 (denoted BS in the figure) in the case of the DVB-S2 standard. The memory 43 is read and write accessible via respective buses of t×P wires.

After the last iteration, the processor bank 42 also delivers hard decision bits, which assume the values "1" or "0" depending on the sign of the sum of the columns of the H matrix and the LLRs for the C' word of the corresponding rank. These hard decision bits are stored temporarily in an output buffer, or hard decision memory 45 (denoted HD_MEM in the figure). The capacity of the memory 45 is equal to N, the size of an LDPC frame. The processor bank 42 can write to the memory 45 via a bus of P wires.

The elements 42, 43, 44 and 45 form the decoding unit of the decoder 52, here an LDPC decoding unit which is configured for processing the data stored in the input memory 41. The blocks of data from the stream S1 and from the stream S2 are multiplexed as input in the form of a stream S3 of data to be decoded, provided as input to this decoding unit.

In an embodiment, K=16200, N=64800, P=360, m=6, and t=6.

In the text below, the term "set" is used in reference to a logical value (called a flag), to signify that "the flag is set to the logical value of 1." Similarly, the term "reset" is used to signify that "the flag is (re)set to the logical value of 0."

In the first embodiment discussed above, at least two flags are associated with each the storage elements 41_i, where i is between 1 and 4. A first flag is denoted "used_i", where i may assume the values of whole numbers between 1 and 4 for each of the respective storage elements 41_i. This "used_i" flag is set (i.e., used_i=1) when the associated storage element 41_i is being write accessed, meaning data to be decoded are currently being written to it, or when it is completely full of data to be decoded which have not yet all been decoded. A second flag denoted "full_i", where i may assume whole numbers between 1 to 4 for each of the respective elements 41_i, is set when the associated storage element is completely full of data to be decoded which have not yet all been decoded.

Figure 6:
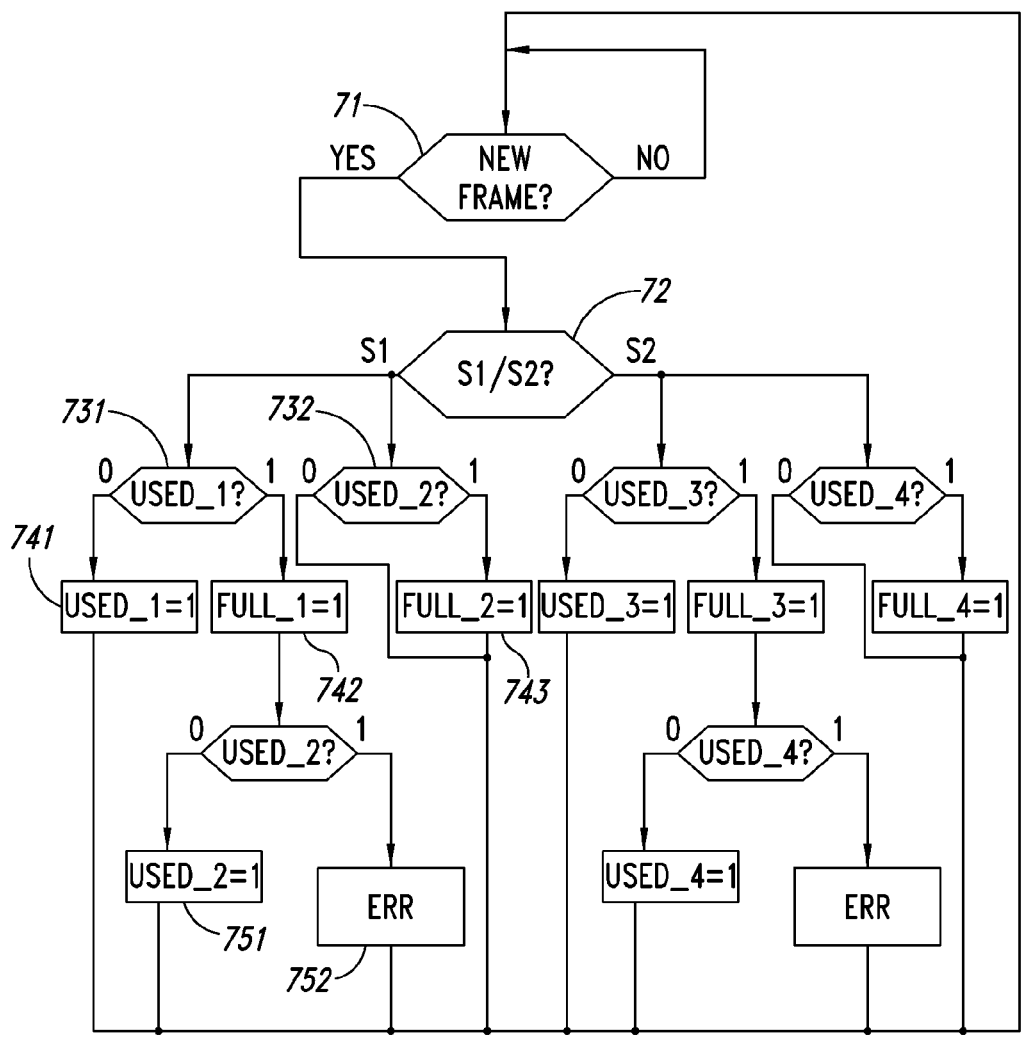
FIG. 6 is a step diagram illustrating a first example of an algorithm for managing writes to the buffers of the input memory of an LDPC decoder according to embodiments of the invention.

With reference to FIG. 6, an algorithm for writing to the input memory 41 according to the first embodiment of the invention is as follows.

In a step 71, it is monitored whether data to be decoded corresponding to a new LDPC frame, which may belong to stream S2 or to stream S2, has been received.

Next, in a step 72, it is identified whether the data received correspond to a frame from the stream S1 or a frame from the stream S2. This identification may be done directly by testing on which of the two buses a new frame has been received as input to the memory 41.

First we will consider the case where the new frame received belongs to the stream S1 (the steps in the left part of the figure). In one step 731, it is determined whether the storage element 41_1 is write accessible, meaning it is not in the process of having data to be decoded written to it and is not already full of data to be decoded which have not yet all been decoded. For this purpose, the used_1 flag is tested.

If it is not set (case where used_1=0), then this means the storage element 41_1 is write accessible. As a result, in a step 741, the bits of the LLRs associated with the newly received frame are stored in element 41_1 and the used_1 flag is set.

If, on the other hand, the used_1 flag is set (case where used_1=1) this means that
(i) the element 41_1 is full of data to be decoded which have not yet all been decoded, in which case the full_1 flag is in principle already set (full_1=1), or that
(ii) this element 41_1 was previously in the process of being written to with data for decoding associated with a frame which is now completely received, in which case, the full_1 flag was not set but should be. This is why, in a step 742, the full_1 flag is set.

As a result, in the case (i) above the full_1 flag is left at 1, and in the case (ii) above, it is changed from 0 to 1.

After the step 742, it is determined whether the storage element 41_2 is write accessible, meaning it is not in the process of having data to be decoded written to it and is not already full of data to be decoded which have not yet all been decoded. For this purpose, the used_2 flag is tested. If this flag is not set (case where used_2=0), this indicates that the element 41_2 is write accessible. In a step 751, the data corresponding to the newly received frame are then saved in element 41_2 and the used_2 flag is then set. Otherwise (case where used_2=1) this indicates that neither of the storage elements 41_1 and 41_2 are available for storing the data corresponding to the newly received frame. In principle, this should not happen if the bit rate constraints on the streams S1 and S2 are met. This is why the algorithm is set up to generate, in a step 752, an error which is then handled in an appropriate manner, for example by skipping a frame.

In a step 732, it is also determined whether the element 41_2 is available. To do this, the used_2 flag is tested. If this flag is set, this indicates that the element 41_2 is already in the process of being written to with data to be decoded, or that it is already full of data to be decoded which have not yet all been decoded. As was the case in the step 742 for the register 41_1, the full_2 flag is then set in a step 743. Otherwise, nothing is done.

A result of the above algorithm is that the data to be decoded which are associated with a newly received frame are stored in the storage element 41_1. In an embodiment, only if this element is not available are the data stored in the element 41_2. As has been said, the case where neither of the two storage elements 41_1 and 41_2 is available should in principle not occur if the bit rate for each of the streams S1 and S2 is less than M/2, where M is the maximum input bit rate for the decoder 52.

The right part of FIG. 6 illustrates steps equivalent to those just described above, but these refer to the handling of the used_i and full_i flags associated with the storage elements 41_3 and 41_4 (with i=3 and i=4), in the case where the newly received frame belongs to the stream S2. These steps are completely symmetrical with those described above for the frames from the stream S1, and therefore do not need to be described again here.

Figure 7:
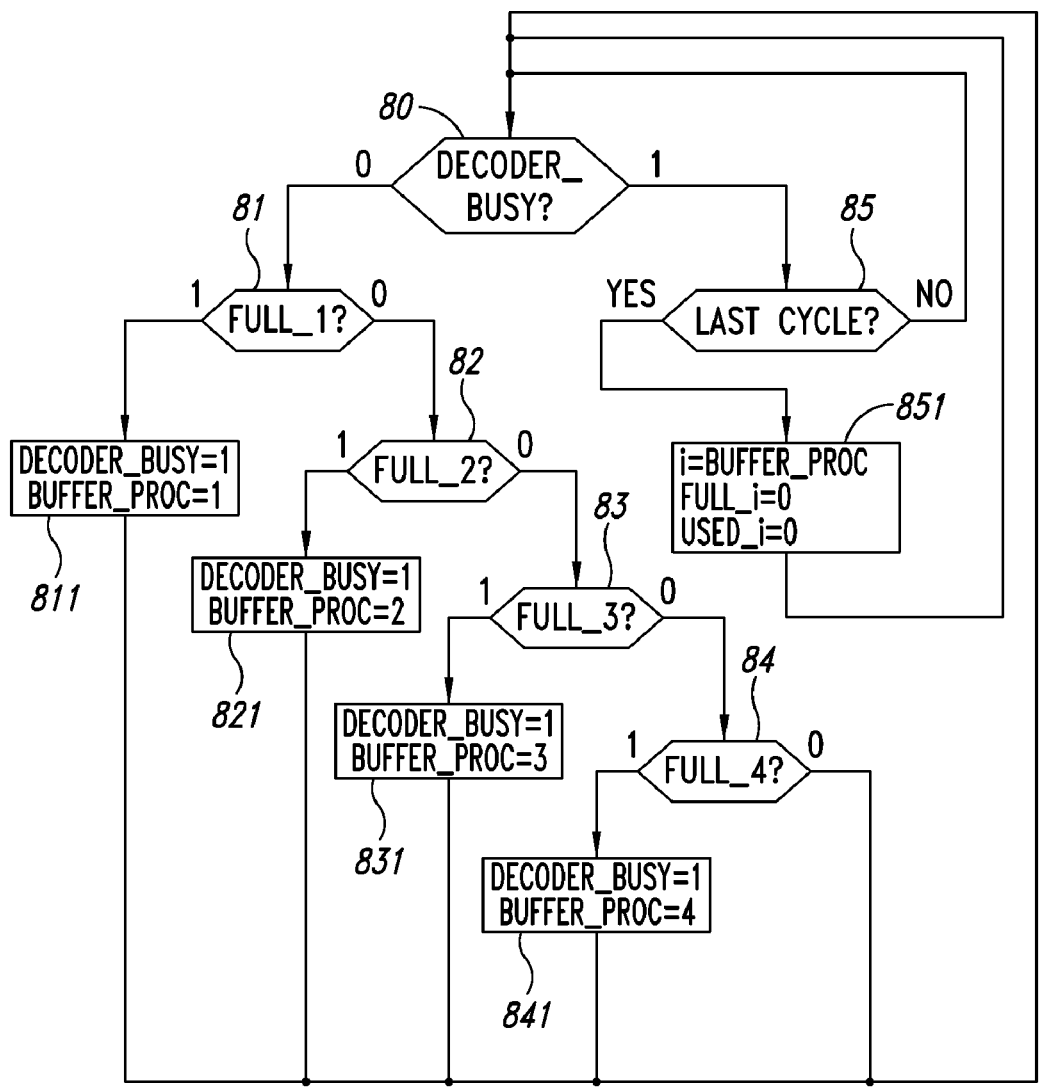
FIG. 7 is a step diagram illustrating an example of an algorithm for managing reads from the buffers of the input memory of a decoder according to some embodiments, in which the write algorithm conforms with the step diagram in FIG. 6 or the step diagrams of FIGS. 8 and 9, FIGS. 8 and 9 are step diagrams illustrating a second example of an algorithm for managing writes to the buffers of the input memory of a decoder according to other embodiments of the invention.

We will now describe the steps in an algorithm for reading from the input memory 41 according to the first embodiment, with reference to FIG. 7. For implementing this algorithm, the decoder maintains a "decoder_busy" flag, which is set when the decoder is busy, meaning in the process of decoding data, and a "buffer_proc" flag, which assumes the value of a whole number between 1 and 4 depending on whether the data stored in the respective elements 41_1, 41_2, 41_3 or 41_4 is in the process of being decoded. The decoder_busy and buffer_proc flags are initialized to 0.

In a step 80, the case where the decoder is busy is distinguished from the case where the decoder is not busy. The decoder_busy flag can be tested for this purpose.

If the decoder_busy flag is not set (decoder_busy=0), meaning the decoder is not busy, the question is whether one of the storage elements 41_i is full of data to be decoded which have not yet all been decoded. For this purpose, the full_i flags, where i is between 1 and 4, are successively tested in the respective steps 81 to 84. In fact, each full_i flag where i is between 2 and 4 is only tested if none of the previously tested full_i flags were set. If it is determined in any of the steps 81 to 84 that the corresponding full_i flag is set, the decoder_busy flag is set and the buffer_proc flag is assigned the corresponding i value between 1 and 4. Then the process proceeds to step 80 without testing the other full_i flags.

If it is determined in step 80 that the decoder_busy flag is set (decoder_busy=1), meaning the decoder is busy, it is decided in a step 85 whether the iterative process for decoding data has reached its last cycle. If this is the case, then in a step 851 the full_i and used_i flags are reinitialized, where i is the whole number corresponding to the value (assumed not to be null) of the buffer_proc flag, and then the algorithm returns to step 80. Otherwise, it returns directly to step 80.

The example algorithm described above gives priority to decoding data stored in the storage elements 41_1, 41_2, 41_3 and 41_4 in that order. Of course, it is possible to do differently. A person skilled in the art will know how to adapt the algorithm in light of the above.

Figure 8:
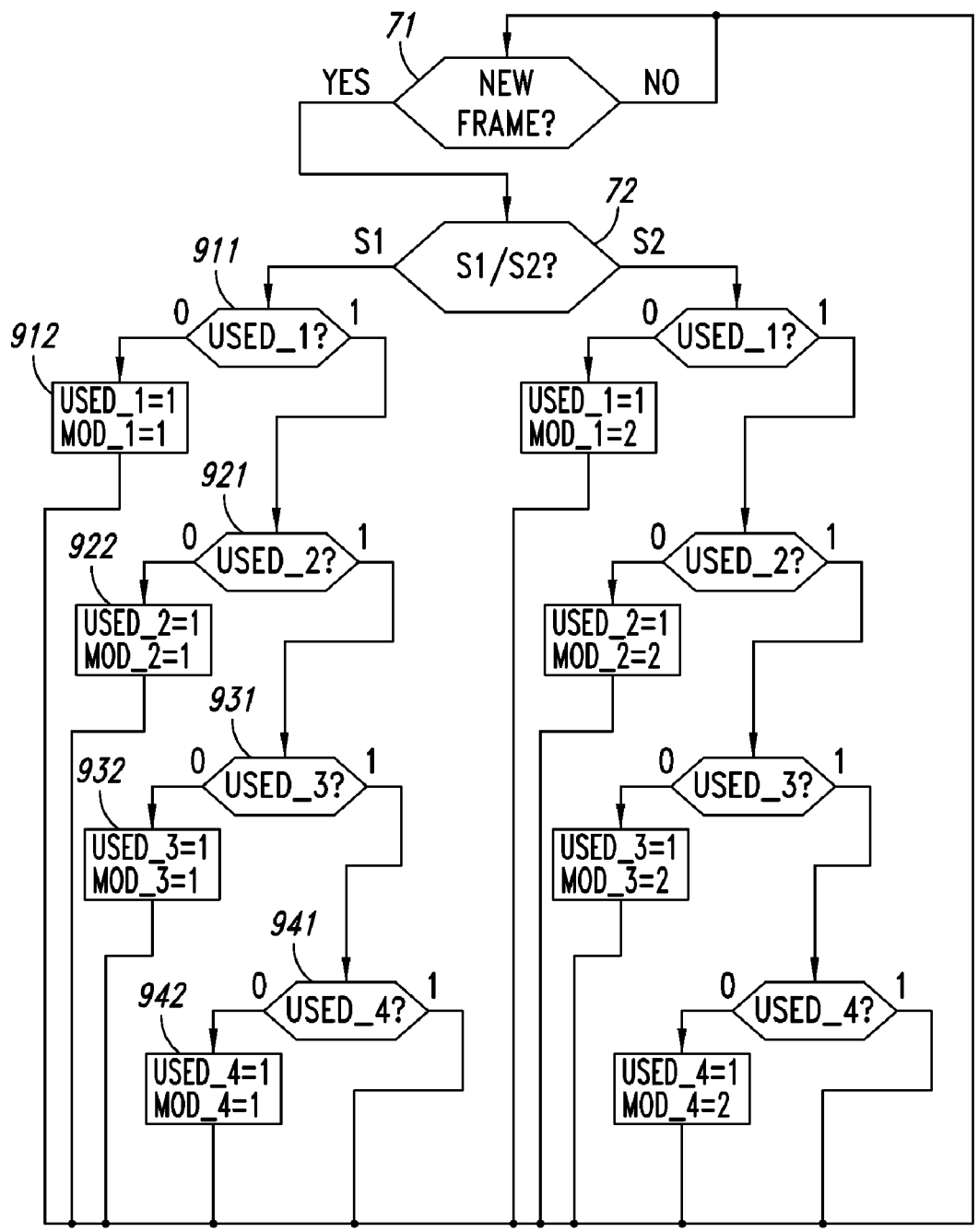
Figure 9:
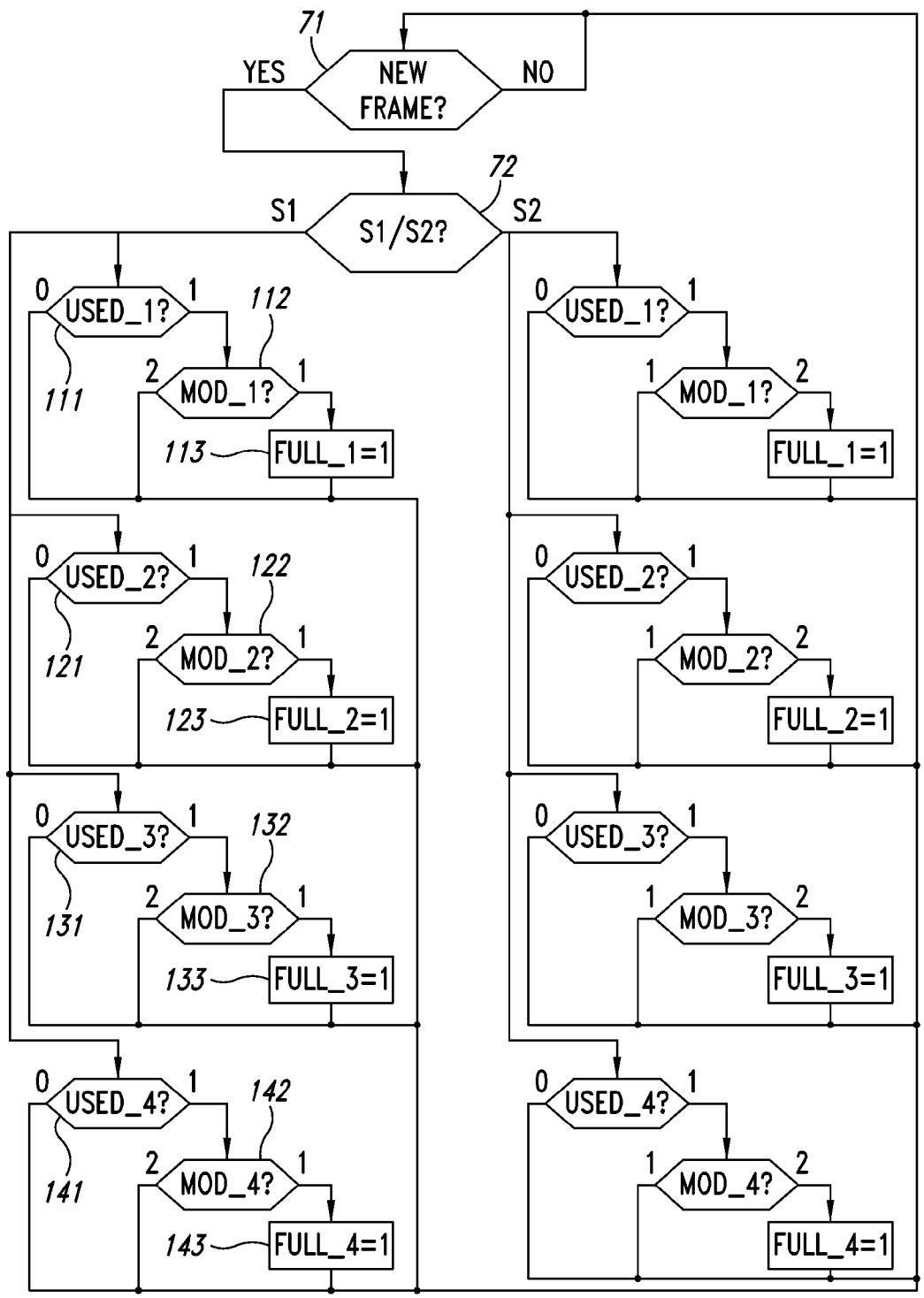

We will now describe an algorithm for writing to the input memory 41 according to the second embodiment, as shown in FIGS. 8 and 9. In this second embodiment, the system maintains an additional flag, denoted "mod_i" where i assumes the value of a whole number between 1 and 4, associated with each of the respective storage elements 41_1, 41_2, 41_3 or 41_4. This mod_i flag assumes the value of 1 or the value of 2 depending on whether the data to be decoded which are stored in the associated storage element 41_i belong to the stream S1 or the stream S2 respectively.

With reference to FIG. 8, which illustrates the management of the used_i and mod_i flags, the algorithm first comprises the steps 71 and 72 previously described in reference to FIG. 6 concerning the first embodiment. These steps are not described again here.

To continue, we will consider first the case where the newly received frame belongs to the stream S1 (the steps in the left part of the figure). In steps 911, 921, 931 and 941, it is determined whether the respective storage elements 41_1, 41_2, 41_3 and 41_4 are write accessible, meaning not in the process of being written to with data to be decoded and not already full of data to be decoded which have not yet all been decoded.

For this purpose, the used_i flag is tested, where i assumes the values of whole numbers between 1 to 4. Each used_i flag, where i is between 2 and 4, is only tested if each of the previously tested used_i flags is set. If it is determined in any of the steps 911, 921, 931 or 941 that the corresponding used_i flag is not set (case where used_i=0), this indicates that the associated storage element is write accessible. As a result, the bits of the LLRs associated with the newly received frame are then stored in the corresponding element 41_i, and the used_i flag is set and the mod_i flag is assigned the value of 1 in the respective step 912, 922, 932 or 942. Then the algorithm passes to step 71, without testing the other used_i flags.

If it is determined in step 941 that the last storage element 41_4 is not available (used_4=1), the algorithm passes to step 71 without storing the LLR bits associated with the newly received frame. In other words, a frame is skipped, but in principle this should not happen if the constraints are met for the maximum bit rate of the streams S1 and S2 related to this embodiment, meaning the sum of the bit rates for each of the streams S1 and S2 is less than M, where M is the maximum input bit rate for the decoder 52.

In one variation, an error routine may be executed, as is the case in the first embodiment (step 752 in FIG. 6).

In the right part of FIG. 8, steps equivalent to those just described above are illustrated, but these refer to the handling of the used_i and mod_i flags when the newly received frame belongs to the stream S2. These steps are symmetrical with those described above for the frames from the stream S1, and therefore do not need to be described again here. One will note merely that, when the bits of the LLRs associated with the newly received frame are stored in element 41_i and the used_i flag is set, here the mod_i flag is assigned the value of 2 (instead of 1 as is the case when the new frame belongs to the stream S1).

With reference to FIG. 9, which illustrates the algorithm for handling the full_i flag, one will note that this algorithm also comprises the first steps 71 and 72 which have already been described in reference to FIG. 6 concerning the first embodiment of the invention.

As before, we will first consider the case where the newly received frame belongs to the stream S1 (the steps in the left part of the figure). In the steps 111, 121, 131 and 141, it is determined whether the respective storage elements 41_1, 41_2, 41_3 and 41_4 are write accessible, meaning not in the process of being written to with data to be decoded and not already full of data to be decoded which have not yet all been decoded.

For this purpose, the used_i flag is tested, where i assumes the values of whole numbers between 1 and 4, in the respective steps 111, 121, 131 and 141.

If it is determined in one of these steps that the corresponding used_i flag is not set (case where used_i=0), meaning the associated storage element 41_i is not currently being used, the algorithm returns to step 71.

Otherwise the flag is set (case where used_i=1), which means that the associated storage element 41_i is currently in use, either being written to with data to be decoded (write access) or already containing data in the process of being decoded but not yet all decoded (read access). In this case, in the respective step 112, 122, 132, or 142, it is determined whether the data stored in the associated storage element belong to the stream S1 or the stream S2.

To do this, the mod_i flag is tested, where i assumes the respective values of a whole number between 1 and 4. If the mod_i flag has the value of 1, this indicates that the data stored in the associated storage element belong to the stream S1. In this case, the full_i flag is set to 1.

Stated otherwise, the fact that the used_i flag is set (used_i=1) and the mod_i flag has the value of 1 (mod_i=1) indicates that (i) the associated storage element is full of data to be decoded which have not yet all been decoded, in which case the full_i flag in principle is already set (full_i=1), or that (ii) this storage element was previously in the process of being written to with data to be decoded associated with a frame which is now completely received, in which case, the full_i flag is not set but should be. This is why, in a respective step 113, 123, 133 or 143, the full_i flag is set.

As a result, in the case (i) above the full_i flag is left at 1, and in the case (ii) above it is changed from 0 to 1.

After the steps 113, 123, 133 or 143, the algorithm returns to step 71.

In the right part of FIG. 9, steps equivalent to those just described above are illustrated, but these relate to the handling of the full_i flag associated with the storage elements 41_i, in the case where the newly received frame belongs to the stream S2. These steps are symmetrical with those described above for the frames from the stream S1, and therefore do not need to be described again here. One will simply note that the full_i flag is set when the mod_i flag has the value of 2 (instead of the value of 1 as is the case when the newly received frame belongs to the stream S1).

The steps in the algorithm for managing the used_i and full_i flags when reading from the storage elements are, in this embodiment, identical to the case in the first embodiment which was described above in reference to FIG. 7, and therefore do not need to be described again here. One will simply note that the mod_i flags do not need to be reinitialized at the time of the read operations. Their value is updated, as needed, when the data to be decoded corresponding to a new frame are stored in the associated storage elements.

The second embodiment allows decoding a data stream having a higher bit rate than M/2, but obviously less than M. This advantage is obtained at the price of a slightly more complex management (three flags to be managed instead of two for each storage element).

Figure 10:
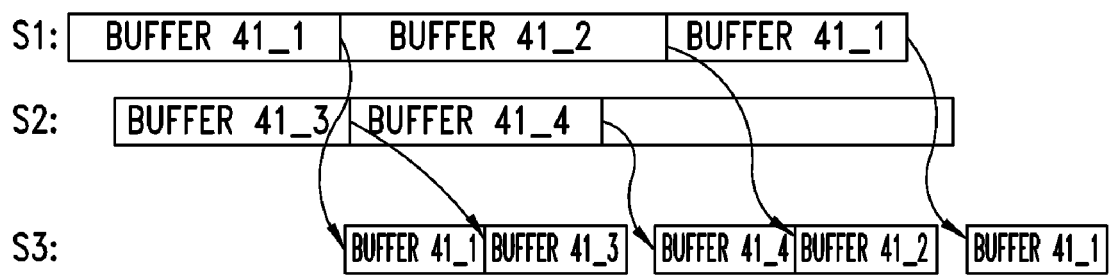
FIG. 10 is a diagram illustrating the operation of a device according to an embodiment of the invention.

FIG. 10 represents blocks of data to be decoded over time (each block represented by a rectangle) from the streams S1 and S2, on the first and second lines respectively, with the horizontal axis representing time. The scheduling of the blocks received and processed by the decoder, corresponding to the stream S3, is represented on the third line. In each rectangle, the reference is given for the storage element (buffer) where the block of data is stored. As is illustrated by the arrows, a block of data should be completely received and stored before its decoding begins.

Embodiments of the invention have been described above in a non-limiting manner. In particular, embodiments of the invention are not limited by the type of block decoding. In addition, a person skilled in the art will appreciate that embodiments of the invention are not limited by the number of data streams to be encoded, and that some embodiments may provide for decoding more than two distinct streams with the same decoder. In reality, all depends on the bit rates of the decoder in comparison to the bit rates of each of the data streams to be decoded or the sum of each of the data streams to be decoded. Furthermore, the management algorithms are non limiting, in particular an algorithm for circular allocation of storage elements for writing can be envisaged.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The above description of illustrated embodiments, including what is described in the Abstract, is not intended to be exhaustive or to limit the invention to the precise forms disclosed. While specific embodiments and examples are described herein for illustrative purposes, various equivalent modifications are possible within the scope of the invention and can be made without deviating from the spirit and scope of the invention.

These and other modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A block decoder, comprising:
a first input and at least a second input for respectively receiving a first data stream to be decoded and a second data stream to be decoded distinct from said first data stream;
an input memory with storage elements configured to store at least one block of data from to first data stream and at least one block of data from the second data stream;
a block decoding unit configured to process, from the input memory, the blocks of data from the first and second data streams to be decoded; and
a control unit to multiplex the blocks of data from the first data stream and the blocks of data from the second data stream as input into the block decoding unit, by saving and reading said blocks in the storage elements of the input memory, wherein
a sum of respective maximum bit rates for each of the first and second data streams is less than M, where M indicates a maximum input bit rate for the block decoding unit; and
the input memory includes at least four storage elements, each configured to store a block of data to be decoded, and used by order of priority or in circular manner to store the data to be decoded from the first data stream and the data to be decoded from the second data stream.

2. A block decoder according to claim 1 wherein at least three flags are associated with each of the storage elements, with a first flag which is set if the associated storage element is in a process of being written to with data to be decoded or is full of data to be decoded which have not yet all been decoded, a see ad flag which is set if said associated storage element is full of data to be decoded which have not yet all been decoded, and a third flag which has a first value if said associated storage element contains data to be decoded from the first data stream and a second value if said associated storage element contains data to be decoded from the second data stream.

3. A block decoder according to claim 1 wherein the storage elements are single port RAM.

4. A block decoder according to claim 1 wherein the block decoding unit is configured to perform LDPC decoding.

5. A system, comprising:
a first demodulator to generate a first data stream be decoded, and a second demodulator to generate a second data stream to be decoded; and
the block decoder to decode the data from the first and second data streams, the block decoder including: I
a first input and at least a second input for respectively receiving a first data stream to be decoded and a second data stream to be decoded distinct from said first data stream;
an input memory with storage elements configured to store at least one block of data from the first data stream and at least one block of data from the second data stream.
a block decoding unit configured to process, from the input memory, the blocks of data from the first and second data streams to be decoded; and
a control unit to multiplex the blocks of data from the first data stream and the blocks of data from the second data stream as input into the block decoding unit, by saving and reading said blocks in the storage elements of the input memory, wherein
a sum of respective maximum bit rates for each of the first and second data streams is less than M, where M indicates a maximum input bit rate for the block decoding unit; and
the input memory includes at least four storage elements, each configured to store a block of data to be decoded, and used by order of priority or in a circular manner to store the data to be decoded from the first data stream and the data to be decoded from the second data stream.

6. The system according to claim 5 wherein the demodulators and block decoder comprise part of a satellite transmission receiver.

7. A process for block decoding, comprising:
receiving a first data stream to be decoded and at least a second data stream to be decoded distinct from said first data stream;
storing, in storage elements of an input memory of a block decoder, at least one block of data from the first data stream and at least one block of data from the second data stream;
block decoding, by the block decoder from the input memory, blocks of data from the first and second data streams; and
multiplexing blocks of data from the first data stream and blocks of data from the second data stream as input to the block decoding, by saving and reading said blocks in the storage elements of the input memory, wherein:
a sum of respective maximum bit rates of each of the first and second data streams is less than M, where M indicates a maximum input bit rate for the block decoding unit; and
the input memory includes at least four storage elements, each configured to store a block of data to be decoded, and used by order of priority or in circular manner to store the data to be decoded from the first data stream and the data to be decoded from the second data stream.

8. A process for block decoding to claim 7 wherein at least three flags are associated with each of the storage elements, with a first flag which is set if the associated storage element is in a process of being written to with data to be decoded or is full of data to be decoded which have not yet all been decoded, a second flag which is set if said associated storage element is full of data to be decoded which have not yet all been decoded, and a third flag which has a first value if said associated storage element contains data to be decoded from the first data stream and a second value if said associated storage element contains data to be decoded from the second data stream.

9. A process for block decoding according to claim 7 wherein the storage elements are single port RAM.

10. A process for block decoding according to claim 7 wherein the block decoding is LDPC decoding.

11. A system, comprising:
means for receiving a first data stream to be decoded and at least a second data stream to be decoded distinct from said first data stream;
means, including storage elements of an input memory of a block decoder, for storing at least one block of data from the first data stream and at least one block of data from the second data stream;
means, included in the block decoder from the input memory, for block decoding blocks of data from the first and second data streams; and
means for multiplexing blocks of data from the first data stream and blocks of data from the second data stream as input to the means for block decoding, by saving and reading said blocks in the storage elements of the input memory; wherein:
a sum of respective maximum bit rates of each of the first and second data streams is less than M, where M indicates a maximum input bit rate for the means for block decoding; and
the input memory includes at least four storage elements, each configured to store a block of data to be decoded, and used by order of priority or in a circular manner to store the data to be decoded from the first data stream and the data to be decoded from the second data stream.

12. The system of claim 11, further comprising:
first demodulator means for generating the first data stream to be decoded; and
second demodulator means for generating the second data stream to be decoded.

13. The system of claim 11 wherein at least three flags are associated with each of the storage elements, with a first flag which is set if the associated storage element is in a process of being written to with data to be decoded or is full of data to be decoded which have not yet all been decoded, a second flag which is set if said associated storage element is full of data to be decoded which have not yet all been decoded, and a third flag which has a first value if said associated storage element contains data to be decoded from the first data stream and a second value if said associated storage element contains data to be decoded from the second data stream.

14. The system of claim 11 wherein at least some of said storage elements includes a single port RAM.

15. The system of claim 11 wherein the block decoder is configured to perform LDPC decoding.

16. An article of manufacture, comprising:
a machine-readable medium having instruction stored thereon that are executable by a processor to process a first data stream and to process a second data stream distinct from the first data stream, by:
storing, in storage elements of an input memory of block decoder, at least one block of data from the first data stream and at least one block of data from the second data stream;
block decoding, by the block decoder from the input memory, blocks of data from the first and second data streams; and
multiplexing blocks of data from the first data stream and blocks of data from the second data stream as input to the block decoding, by saving and reading said blocks in the storage elements of the input memory, wherein:
a sum of respective maximum bit rates of each of the first and second data streams is less than M, where M indicates a maximum input bit rate for the block decoder; and
the input memory includes at least four storage elements, each configured to store a block of data to be decoded, and used by order of priority or in a circular manner to store the data to be decoded from the first data stream and the data to be decoded from the second data stream.

17. The article of manufacture of claim 16 wherein at least three flags are associated with each of the storage elements, with a flag which is set if the associated storage element is in a process of being written to with data to be decoded or is full of data to be decoded which have not yet all been decoded, a second flag which is set if said associated storage element is full of data to be decoded which have not yet all been decoded, and a third flag which has a first value if said associated storage element contains data to be decoded from the first data stream and a second value if said associated storage element contains data to be decoded from the second data stream.

18. The article of manufacture of claim 16 wherein at least some of said storage elements includes a single port RAM.

19. The article of manufacture of claim 16 wherein the block decoder is configured to perform LDPC decoding.

* * * * *

UNITED STATES PATENT AND TRADEMARK OFFICE
CERTIFICATE OF CORRECTION

PATENT NO.         : 7,725,810 B2
APPLICATION NO.    : 11/534476
DATED              : May 25, 2010
INVENTOR(S)        : Laurent Paumire et al.

It is certified that error appears in the above-identified patent and that said Letters Patent is hereby corrected as shown below:

Column 12, Line 25
"decoded, a see ad flag which is set if said associated storage" should read as
--decoded, a second flag which is set if said associated storage--.

Column 12, Line 37
"a first demodulator to generate a first data stream be" should read as --a first demodulator to generate a first data stream to be--.

Column 12, Line 41
"second data streams, the block decoder including: I" should read as --second data streams, the block decoder including:--.

Column 12, Line 49
"data stream." should read as --data stream:--.

Column 14, Line 48
"with a flag which is set if the associated storage element is in" should read as
--with a first flag which is set if the associated storage element is in--.

Signed and Sealed this

Twenty-first Day of December, 2010

David J. Kappos
*Director of the United States Patent and Trademark Office*